(12) United States Patent
Whelan et al.

(10) Patent No.: US 6,232,591 B1
(45) Date of Patent: May 15, 2001

(54) LIGHT DETECTION DEVICE

(75) Inventors: John Whelan; Graham Henry Stout, both of Glasgow (GB)

(73) Assignee: Atmel Research, Georgetown (KY)

( * ) Notice: Subject to any disclaimer, the term of this patent is extended or adjusted under 35 U.S.C. 154(b) by 0 days.

(21) Appl. No.: 09/308,606

(22) PCT Filed: Nov. 3, 1997

(86) PCT No.: PCT/EP97/06168

§ 371 Date: Jul. 29, 1999

§ 102(e) Date: Jul. 29, 1999

(87) PCT Pub. No.: WO98/22905

PCT Pub. Date: May 28, 1998

(30) Foreign Application Priority Data

Nov. 21, 1996 (GB) .................................................. 9624198

(51) Int. Cl.$^7$ .................................................. H01J 40/14
(52) U.S. Cl. ...................................... 250/214 R; 327/514
(58) Field of Search ............................ 250/214 R, 214 A, 250/214.1, 214 C, 208.2; 327/514; 330/288, 308

(56) References Cited

U.S. PATENT DOCUMENTS 4,910,707 * 3/1990 Schrenk ................................ 365/185
4,952,796 * 8/1990 Fruhauf et al. .................. 250/214 R

FOREIGN PATENT DOCUMENTS

0437307A2 * 7/1991 (EP) .
2074788A * 11/1981 (GB) .

* cited by examiner

*Primary Examiner*—Stephone B. Allen
(74) *Attorney, Agent, or Firm*—Thomas Schneck

(57) ABSTRACT

A light detection device has a biasing transistor (1) arranged to provide a bias current and a reverse biased transistor. The reverse biased transistor has a drain terminal (6) coupled via a high impedance resistor (4) to the supply voltage. Incident visible light is detected by a voltage drop at the drain electrode.

5 Claims, 1 Drawing Sheet

LIGHT DETECTION DEVICE

FIELD OF THE INVENTION

Figure 1:
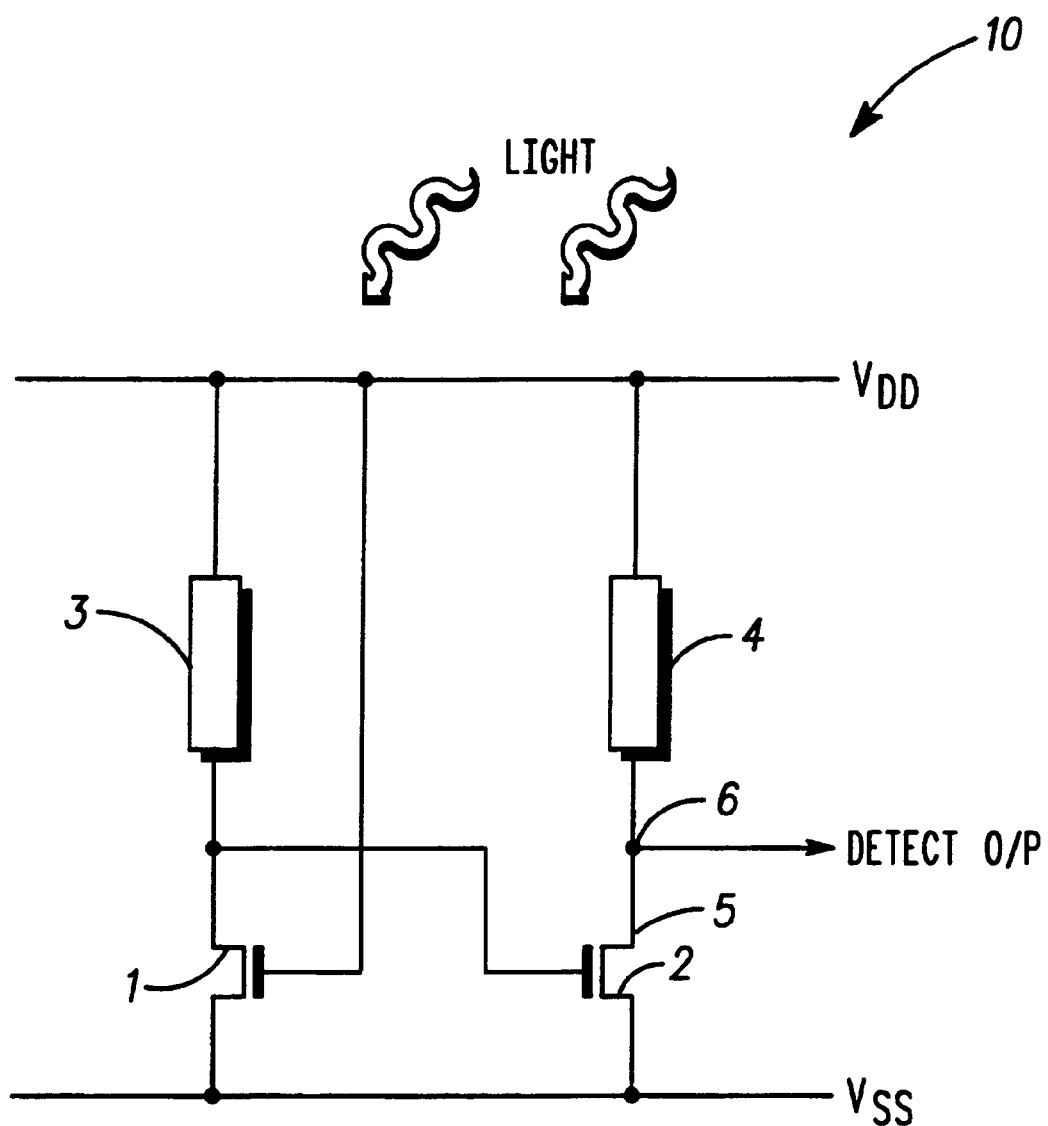

This invention relates to light detection devices and particularly but not exclusively to light detection devices for use in tamper detection applications.

BACKGROUND OF THE INVENTION

In a semiconductor integrated circuit (IC), such as a banking smartcard, the IC is vulnerable to a breach of security if it falls into the hands of a dishonest person. The IC may be reverse engineered in order to reveal or modify functions and confidential data contained therein. It is known that such IC's have been decapsulated and have even undergone depassivation of the upper protective layer.

U.S. Pat. No. 4,952,796 describes a circuit which comprises a current generator delivering current which flows into a reversed biased transistor junction. If subject to light, the reverse current in the junction increases, and the voltage at the junction terminals drops.

A problem with this arrangement is that incident light will generate reverse currents in transistors 11 and 2 of FIG.1, and this may affect the voltage drop detected at the output. Furthermore, the biasing and current generation functions of the above circuit are more susceptible to manufacturing process variations.

Also current drain, particularly in a smartcard, should be kept to a minimum, and the reverse current adversely affects the current consumption of the device. Lastly, the above circuit takes up much valuable semiconductor area, and again this is disadvantageous in a smartcard, where demand for space is at a premium.

This invention seeks to provide a light detection device which mitigates the above mentioned disadvantages.

SUMMARY OF THE INVENTION

According to the present invention there is provided a light detection device comprising: a biasing transistor, arranged to provide a bias current; a reverse biased transistor having a control electrode arranged to be reverse biased by the bias current and having a conducting electrode; and, a resistor coupled between a supply voltage and the conducting electrode of the reverse biased transistor; wherein incident visible light is detected by a voltage drop at the conducting electrode of the reverse biased transistor.

In this way a light detection device is provided which does not generate parasitic reverse currents, and is less susceptible to manufacturing process variations.

BRIEF DESCRIPTION OF THE DRAWING(S)

An exemplary embodiment of the invention will now be described with reference to the single figure drawing which shows a preferred embodiment of a light detection device in accordance with the invention.

DETAILED DESCRIPTION OF A PREFERRED EMBODIMENT

Referring to the single figure drawing, there is shown a light detection device 10, arranged to be integrated with an IC.

The device 10 comprises a first transistor 1, having a gate terminal coupled to a supply voltage Vdd, a source terminal coupled to a ground terminal Vss and a drain terminal coupled to the supply voltage Vdd via a first high impedance resistor 3. The first transistor 1 is thus arranged to provide a bias current to be further described below.

A second transistor 2 of the device 10 has a gate terminal coupled to the drain terminal of the first transistor 1, a source terminal coupled to the ground terminal Vss and a drain terminal 5 coupled to the supply voltage Vdd via a second high impedance resistor 4, and further coupled to an output terminal 6. The high impedance resistor 4 is an undoped polysilicon resistor.

In operation, the gate terminal of the second transistor 2 is arranged to be reverse biased by receiving the bias current from the drain terminal of the first transistor 1.

When the drain terminal 5 of the second transistor is subjected to incident visible light, a small reverse current is generated between drain 5 and the ground terminal Vss. This current flow lowers the voltage at drain 5, and this voltage drop is detected by circuitry (not shown) coupled to the output terminal 6.

Since the second high impedance resistor is an undoped polysilicon resistor, extremely small currents can be detected, making the device 10 very sensitive to incident light.

No parasitic reverse currents are generated, and during the manufacturing process of the device 10, only one resistivity process is required to fabricate the first and the second high impedance resistors 3 and 4, and this will not introduce variations which will significantly affect the performance of the device 10.

It will be appreciated that alternative embodiments to the one described above are possible. For example, the biasing arrangement may vary from the precise configuration described above. In addition, the first and second resistors could be fabricated from a material other than undoped polysilicon.

What is claimed is:

1. A light detection device comprising:
   a biasing circuit arranged to provide a bias current;
   a reverse biased transistor having a control electrode arranged to be reverse biased by the bias current and having a conducting electrode arranged to receive incident visible light; and,
   a high impedance resistor coupled between a supply voltage and the conducting electrode of the reverse biased transistor;
   wherein incident visible light is detected by a voltage drop at the conducting electrode of the reverse biased transistor.

2. The device of claim 1 wherein the resistor is an undoped polysilicon resistor.

3. The device of claim 1, or 2 wherein the biasing circuit comprises a biasing transistor having a conducting electrode coupled to the supply voltage via a biasing resistor.

4. A smart-card incorporating the device of claim 1.

5. A light detection device comprising:
   a reverse biased transistor having a control electrode and a conducting electrode, said conducting electrode being arranged to receive incident light;
   a biasing circuit arranged to provide a bias current to the control electrode of the reverse biased transistor; and
   a high impedance resistor coupled between a supply voltage and the conducting electrode of the biased transistor, said high impedance resistor providing a constant resistance;
   wherein incident visible light is detected by a voltage drop at the conducting electrode of the reverse biased transistor.

* * * * *